United States Patent
Kassel

(10) Patent No.: US 10,600,635 B2
(45) Date of Patent: Mar. 24, 2020

(54) METHOD AND APPARATUS FOR A SEMICONDUCTOR-ON-HIGHER THERMAL CONDUCTIVE MULTI-LAYER COMPOSITE WAFER

(71) Applicant: Elyakim Kassel, Moreshet (IL)

(72) Inventor: Elyakim Kassel, Moreshet (IL)

(*) Notice: Subject to any disclaimer, the term of this patent is extended or adjusted under 35 U.S.C. 154(b) by 0 days.

(21) Appl. No.: 15/956,762

(22) Filed: Apr. 19, 2018

(65) Prior Publication Data

US 2018/0308682 A1  Oct. 25, 2018

Related U.S. Application Data

(60) Provisional application No. 62/487,499, filed on Apr. 20, 2017.

(51) Int. Cl.
| | |
|---|---|
| H01L 29/20 | (2006.01) |
| H01L 29/30 | (2006.01) |
| H01L 21/20 | (2006.01) |
| H01L 21/02 | (2006.01) |
| H01L 21/304 | (2006.01) |

(52) U.S. Cl.
CPC .. *H01L 21/02032* (2013.01); *H01L 21/02002* (2013.01); *H01L 21/02167* (2013.01); *H01L 21/02378* (2013.01); *H01L 21/304* (2013.01)

(58) Field of Classification Search
CPC .......... H01L 29/20; H01L 21/20; H01L 29/30
USPC .................. 257/615, 617; 438/483, 285, 691
See application file for complete search history.

(56) References Cited

U.S. PATENT DOCUMENTS

| | | |
|---|---|---|
| 3,954,483 A | 5/1976 | Prochazka |
| 4,571,610 A | 2/1986 | Matsushita et al. |
| 4,816,422 A | 3/1989 | Yerman et al. |
| 6,309,766 B1 | 10/2001 | Sullivan |
| 7,262,113 B2 | 8/2007 | Ghyselen et al. |
| 7,422,957 B2 | 9/2008 | Ghyselen et al. |
| 8,153,504 B2 | 4/2012 | Frederic et al. |
| 8,470,687 B2 | 6/2013 | Forbes et al. |
| 8,507,922 B2 | 8/2013 | Kawamoto et al. |
| 2002/0096106 A1* | 7/2002 | Kub ............. H01L 21/2007 117/94 |
| 2005/0258483 A1* | 11/2005 | Templier ............. H01L 29/868 257/341 |

(Continued)

*Primary Examiner* — Sheng-Bai Zhu
(74) *Attorney, Agent, or Firm* — Haim M. Factor—1st-Tech-Ideas

(57) ABSTRACT

A method for fabricating a cost-effective semiconductor on higher-thermal conductive multilayer (ML) composite wafer, the method comprising the steps of: taking a semiconductor host wafer having a first and a second host wafer surface and preparing the first host wafer surface; growing a transitional layer (TL) having properties of limiting diffusion on the host wafer first surface; depositing a uniform and low-defect additional layer (AL) on the TL; polishing the TL to prepare for bonding; taking a sacrificial semiconductor wafer, having a first and second sacrificial wafer surface, and bonding the first sacrificial wafer surface to the TL at room temperature; removing the sacrificial wafer from the TL and recycling the sacrificial wafer for future use; and grinding and polishing the first host wafer surface; whereby the resultant first host wafer surface becomes a starting surface of the ML composite wafer for device manufacturing.

7 Claims, 7 Drawing Sheets

(56) References Cited

U.S. PATENT DOCUMENTS

Figure 1A:
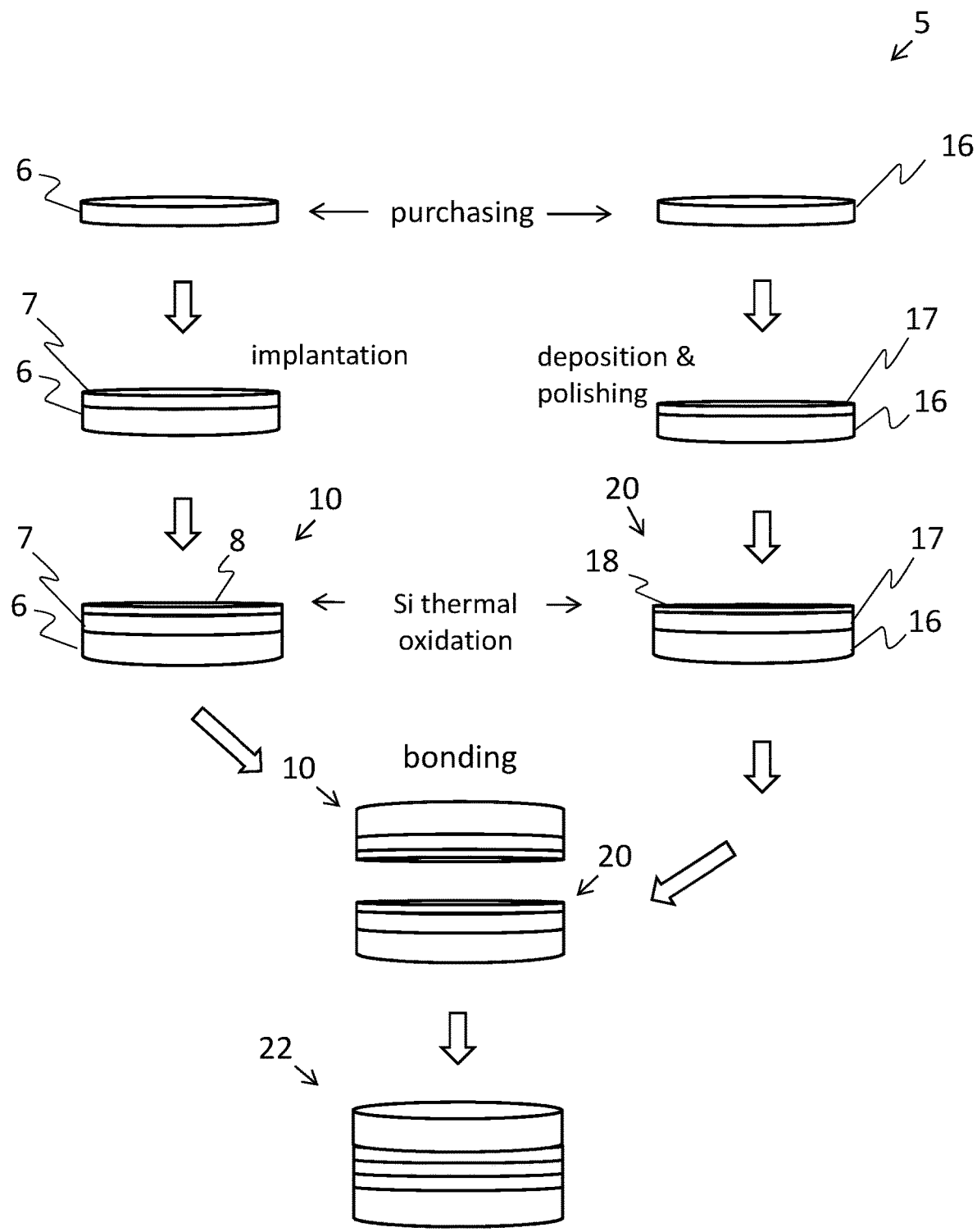

| | | | |
|---|---|---|---|
| 2009/0050938 A1* | 2/2009 | Miyoshi | H01L 29/1033 257/194 |
| 2009/0278233 A1* | 11/2009 | Pinnington | H01L 21/02389 257/615 |
| 2009/0294910 A1* | 12/2009 | Katoh | H01L 21/02005 257/618 |
| 2009/0321747 A1* | 12/2009 | Murphy | H01L 21/76254 257/77 |
| 2014/0030892 A1* | 1/2014 | Honke | H01L 21/0445 438/691 |
| 2016/0372628 A1* | 12/2016 | Henley | H01L 33/0079 |

* cited by examiner

Prior Art (continued)

(a)

(b)

(c)

METHOD AND APPARATUS FOR A SEMICONDUCTOR-ON-HIGHER THERMAL CONDUCTIVE MULTI-LAYER COMPOSITE WAFER

FIELD OF THE INVENTION AND BACKGROUND

The current invention relates to a silicon on higher thermal conductive multi-layer composite wafer and methods thereof.

In the specification and claims which follows, the expression "semiconductor" is intended to interchangeably mean "semiconductor material", such as, but not limited to: silicon and gallium-nitride; which are typically produced in a wafer shape and serve as a base or substrate material, as known in the art in the semiconductor industry. The terms "silicon" or "Si" are likewise intended to mean a silicon crystalline material, typically produced in a wafer shape and serving as a base or substrate material, as known in the art in the semiconductor industry. "SiC" is intended to mean a silicon carbide material, likewise typically produced in a wafer shape and serving as a base or substrate material, as known in the art.

The semiconductor integrated circuit (IC) industry has been driven for decades by the capability to shrink devices and to package them into increasingly higher circuit densities. The resultant power dissipation of such silicon-based devices poses a risk of yielding thermal levels which are incompatible with proper device operation.

Other developments related to leakage current management have led to the introduction of a family of substrates called Silicon-on-Insulator (SOI). This type of substrate offers many advantages for operating high-power devices, except that the insulator layer typically has poor thermal conductivity, which can yield high device operating temperature and thus limit device density.

An attractive solution to allow maintaining device performance at a lower operating temperature is to use a composite wafer as a starting material. Such an approach is proposed in U.S. Pat. No. 8,153,504, whose disclosure is incorporated herein by reference, in which Allibert et al. describe a process for manufacturing a composite substrate comprising bonding a first substrate onto a second semiconducting substrate, characterized in that the process includes, before bonding, the formation of a bonding layer between the first and the second substrate, the bonding layer comprising a plurality of islands distributed over a surface of the first substrate in a determined pattern and separated from one another by regions of a different type, which are distributed in a complementary pattern, wherein the islands are formed via a plasma treatment of the material of the first substrate.

An approach described by Alibert et al. hereinabove addresses materials science issues but has not been applied in industry due to the complexity and associated high cost of the proposed manufacturing process of the composite substrate.

Among additional prior art touching upon these and similar problems and solutions are:

Kawamoto et al., in U.S. Pat. No. 8,507,922, whose disclosure is incorporated herein by reference, describe a silicon carbide substrate which has less high frequency loss and excellent heat dissipating characteristics. The silicon carbide substrate is provided with a first silicon carbide layer (1), which is composed of a polycrystalline silicon carbide, and a second silicon carbide layer (2), which is composed of polycrystalline silicon carbide formed on the surface of the first silicon carbide layer. The second silicon carbide layer (2) has a high-frequency loss smaller than that of the first silicon carbide layer (1), the first silicon carbide layer (1) has a thermal conductivity higher than that of the second silicon carbide layer (2), and on the surface side of the second silicon carbide layer (2), the high-frequency loss at a frequency of 20 GHz is 2 dB/mm or less, and the thermal conductivity is 200 W/mK or more.

U.S. Pat. No. 8,470,687, whose disclosure is incorporated herein by reference, in which Forbes et al. describe a method for forming a wafer with a strained semiconductor. In various embodiments of the method, a predetermined contour is formed in one of a semiconductor membrane and a substrate wafer. The semiconductor membrane is bonded to the substrate wafer and the predetermined contour is straightened to induce a predetermined strain in the semiconductor membrane. In various embodiments, a substrate wafer is flexed into a flexed position, a portion of the substrate wafer is bonded to a semiconductor layer when the substrate wafer is in the flexed position, and the substrate wafer is relaxed to induce a predetermined strain in the semiconductor layer.

Matsushita et al., in U.S. Pat. No. 4,571,610, whose disclosure is incorporated herein by reference, describe semiconductor devices in which an electrical insulating substrate is made of a sintered silicon carbide body having thermal conductivity of at least 0.4 cal/cm.-sec.-degree C. at 25 degrees C.

U.S. Pat. No. 6,309,766, whose disclosure is incorporated herein by reference, in which Sullivan describes a substrate made of polycrystalline. beta. SiC and having an essentially pore-free surface. The substrate is adapted for use as a wafer component to support different thin films as part of manufacturing for discrete or integrated circuit electronic devices. The substrate comprises a polycrystalline silicon carbide outer surface with {111} crystal planes exposed on the working surface, the outer surface is essentially pore free or without exposed pores, scratches, steps or other such depressions or discontinuities on the surface of the substrate having at least one dimension larger than 2.54 microns, and no non-stoichiometric silicon or carbon other than that which may be residual from the process of making silicon carbide ceramic material.

Yerman et al., in U.S. Pat. No. 4,816,422, whose disclosure is incorporated herein by reference, describe a method for fabricating a composite semiconductor from a plurality of substantially identical individual semiconductor devices formed on a common semiconductor wafer includes testing the devices on the wafer to generate a positional mapping of acceptable and non-acceptable devices, dividing the wafer into a plurality of areas of arbitrary size, connecting corresponding contact pads on only the acceptable devices within a given area to each other via common conductive paths which are supported on a dielectric film covering the pads, the film having appropriately located holes filled with conductive material to electrically couple the common conductive paths and the underlying contact pads of only the acceptable devices. The devices within a given area are intercoupled in a manner to form an operational array; single or multiple arrays may be coupled together to form a composite package having common external contacts and heat sink supports.

U.S. Pat. No. 3,954,483, whose disclosure is incorporated herein by reference, in which Prochazka describes a dense silicon carbide material having improved electrically conducting properties is disclosed which is prepared by forming a homogeneous dispersion of silicon carbide, a sufficient amount of boron nitride, and optionally a boron containing additive and hot pressing the dispersion at a sufficient temperature and pressure whereby a dense substantially nonporous ceramic is formed. The silicon carbide material can be machined by electrical discharge machining or by electrochemical machining.

Additionally, Ghyselen et al., in U.S. Pat. Nos. 7,262,113 and 7,422,957 whose disclosures are incorporated herein by reference, describe, inter alia, methods for fabricating final substrates for use in optics, electronics, or optoelectronics are described. The method includes forming a zone of weakness beneath a surface of a source substrate to define a transfer layer; detaching the transfer layer from the source substrate along the zone of weakness; depositing a useful layer upon the transfer layer; and depositing a support material on the useful layer to form the final substrate. The useful layer may be deposited on the transfer layer before or after detaching the transfer layer from the source substrate. The useful layer is typically made of a material having a large band gap, and comprises at least one of gallium nitride, or aluminum nitride, or of compounds of at least two elements including at least one element of aluminum, indium, and gallium. The zone of weakness may advantageously be formed by implanting atomic species into the source substrate.

As noted previously, prior art solutions, including those by Ghyselen et al, of Soitec Silicon on Insulator Technologies SA hereinabove have not been applied in industry due to the complexity and associated high cost of the proposed process of manufacturing the composite substrate.

Figure 1B:
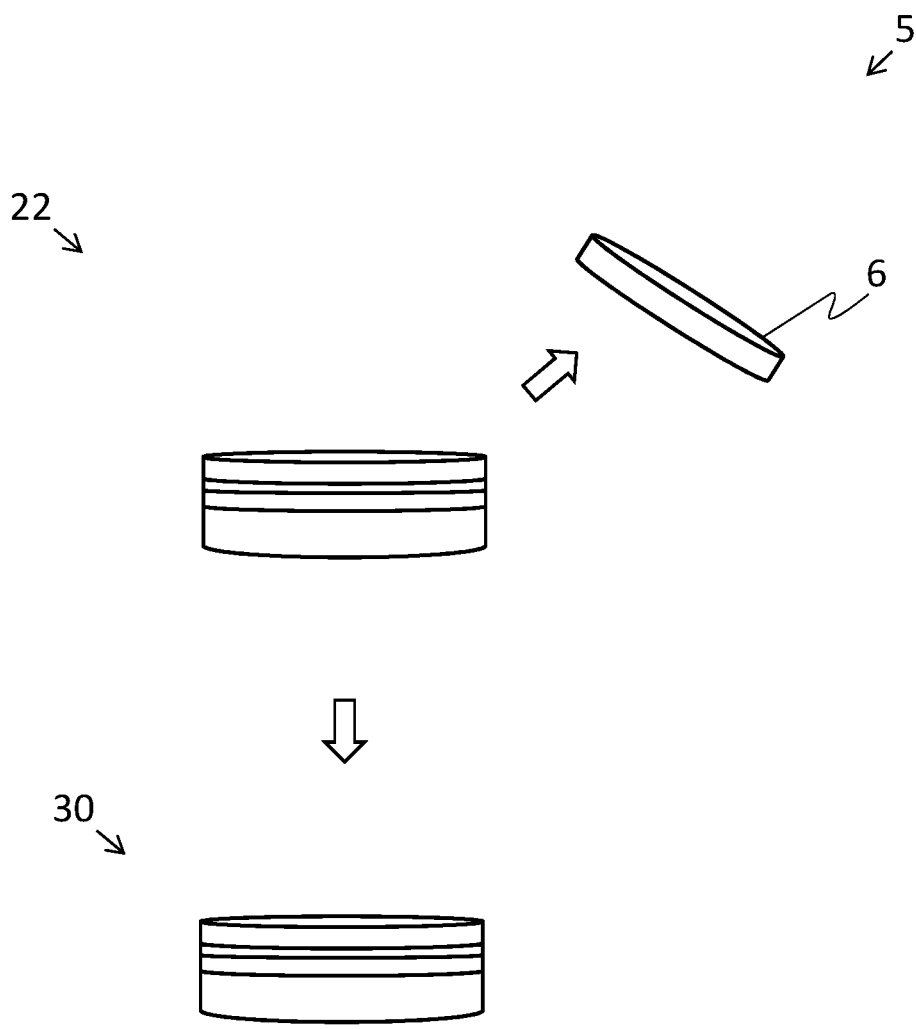

Reference is currently made to FIGS. 1A-1B, which are schematic illustrations showing major steps of a Prior Art manufacturing process 5 of Silicon on Poly Silicon Carbide (SiC) wafers, such as described in the Soitec reference hereinabove. Process 5 starts with two parallel manufacturing paths, shown in the figure, as follows:

1. A silicon wafer 6 (also referred hereinbelow as a "host" silicon wafer) is purchased. The wafer typical cost is approximately $50.
2. Silicon wafer 6 then undergoes H/He implantation 7, as known in the art, the current step costing about $100.
3. A layer of Si thermal oxide (SiO2) 8 is then deposited, on the silicon wafer, yielding wafer 10 as indicated in the figure. The oxide step costs typically $50.
4. In parallel to steps 1-3 above, a Poly Silicon Carbide (pSiC) wafer 16 is purchased. The typical cost of the pSIC wafer is approximately $500.
5. pSiC wafer 16 then undergoes a-Si CVD deposition and CMP polishing 17, both as known in the art; the current step costing about $100.
6. A layer of Si thermal oxide (SiO2) 18 is then deposited, yielding wafer 20, as indicated in the figure. The oxide step costs typically $50.
7. At this point, wafer 10 (from steps 1-3) and wafer 20 (from steps 4-6) are bonded, with respective oxide layers of each bonded to each other. This creates a bonded wafer 22; and the current step costs approximately $50.
8. Continuing with process 5 (referring to FIG. 1B) host silicon wafer 6 is removed from bonded wafer 22. The current step costs about $50.
9. Following removal of the host silicon wafer, the remaining bonded wafer undergoes CMP polishing, as known in the art, yielding a completed Silicon on Poly Silicon Carbide wafer 30. The current CMP polishing steps costs approximately $50.

Applying process step costs known in the art, as described in FIGS. 1A-1B hereinabove, it is estimated that the prior art process described hereinabove yields starting-wafer/starting material costs of at least $1,000, which is an excessively high cost.

There is therefore a need to maintain device performance at a lower operating temperature using a composite wafer as starting material—and to do so in a cost-effective manner commensurate with modern semiconductor fabrication constraints to enable a cost-effective process.

SUMMARY OF INVENTION

According to the teachings of the current invention, there is provided a method for fabricating a cost-effective semiconductor on higher-thermal conductive multilayer (ML) composite wafer, the method comprising the steps of: taking a semiconductor host wafer having a first and a second host wafer surface and preparing the first host wafer surface; growing a transitional layer (TL) having properties of limiting diffusion on the first host wafer surface; depositing a uniform and low-defect additional layer (AL) on the TL; polishing the AL to prepare for bonding; taking a sacrificial semiconductor wafer, having a first and second sacrificial wafer surface, and bonding the first sacrificial wafer surface to the AL at room temperature; removing the sacrificial wafer from the AL and recycling the sacrificial wafer for future use; and grinding and polishing the second host wafer surface; whereby the second host wafer surface becomes a starting surface of the ML composite wafer for device manufacturing. Preferably, the TL and the AL are formed of at least one material chosen from the list including: poly silicon carbide (pSiC); and high oriented-cubic phase 3C—SiC polytype crystal structure of silicon carbide (3C—SiC). Most preferably, preparing the first host wafer surface includes a surface pretreatment which allows growth of polycrystalline, cubic type βSiC layers. Typically, the growth of polycrystalline, cubic type βSiC layers is compatible with all wafer diameters and is not dependent on a fixed-diameter pSIC wafer. Most typically, the ML composite wafer has a total manufacturing cost ranging substantially from $200 to $300. Preferably, the host and sacrificial wafers are formed of silicon. Most preferably, growing and depositing include vapor deposition methods.

According to the teachings of the current invention, there is further provided a method for fabricating a cost-effective semiconductor on higher-thermal conductive multilayer (ML) composite wafer, the method comprising the steps of: taking a semiconductor host wafer having a first and a second host wafer surface and preparing the first host wafer surface; growing a transitional layer (TL) having properties of limiting diffusion on the host wafer first surface; depositing a uniform and low-defect additional layer (AL) on the TL; polishing the TL to prepare for bonding; taking a sacrificial semiconductor wafer, having a first and second sacrificial wafer surface, and bonding the first sacrificial wafer surface to the TL at room temperature; removing the sacrificial wafer from the TL and recycling the sacrificial wafer for future use; and grinding and polishing the first host wafer surface; whereby the resultant first host wafer surface becomes a starting surface of the ML composite wafer for device manufacturing. Preferably, the TL and the AL are formed of at least one material chosen from the list including: poly silicon carbide (pSiC); and high oriented-cubic phase 3C—SiC polytype crystal structure of silicon carbide (3C—SiC). Most preferably, preparing the first host wafer surface includes a surface pretreatment which allows growth of polycrystalline, cubic type βSiC layers. Typically, the growth of polycrystalline, cubic type βSiC layers is compatible with all wafer diameters and is not dependent on a fixed-diameter pSIC wafer. Most typically, the ML composite wafer has a total manufacturing cost ranging substantially from $200 to $300. Preferably, the host and sacrificial wafers are formed of silicon. Most preferably, growing and depositing include vapor deposition methods.

According to the teachings of the current invention, there is further provided a semiconductor on higher-thermal conductive multilayer (ML) composite wafer comprising: a semiconductor host wafer having a first and a second host wafer surface, the first host wafer surface pretreated to allow growth of polycrystalline, cubic type βSiC layers; a transitional layer (TL) having properties of limiting diffusion, the TL grown on the first host wafer surface; a uniform and low-defect additional layer (AL) deposited on the TL and the TL being polished for bonding; a sacrificial semiconductor wafer having a first and second sacrificial wafer surface, the first sacrificial wafer surface bonded to the TL at room temperature; and the sacrificial wafer removed from the TL and further recycled for future use, wherein the first host wafer surface, following grinding and polishing, is a starting surface of the ML composite wafer for device manufacturing. Preferably, the TL and the AL are formed of at least one material chosen from the list including: poly silicon carbide (pSiC); and high oriented-cubic phase 3C—SiC polytype crystal structure of silicon carbide (3C—SiC). Most preferably, the growth of polycrystalline, cubic type βSiC layers is compatible with all wafer diameters and is not dependent on a fixed-diameter pSIC wafer. Typically, the ML composite wafer has a total manufacturing cost ranging substantially from $200 to $300.

LIST OF FIGURES

Figure 2A:
Figure 2A:
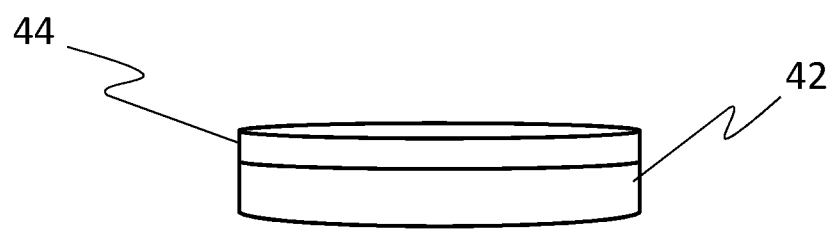
Figure 2A:
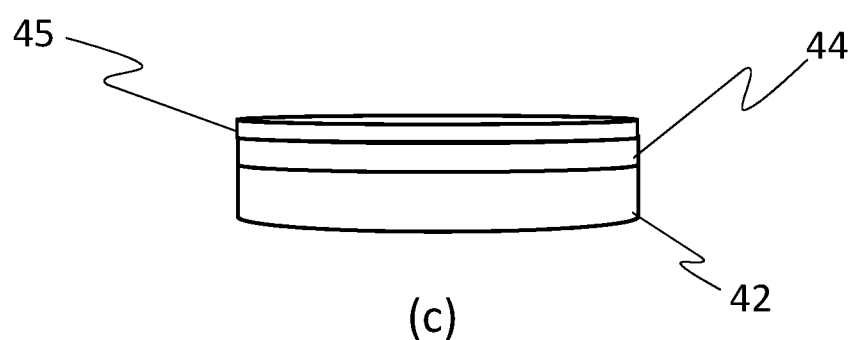
Figure 2B:
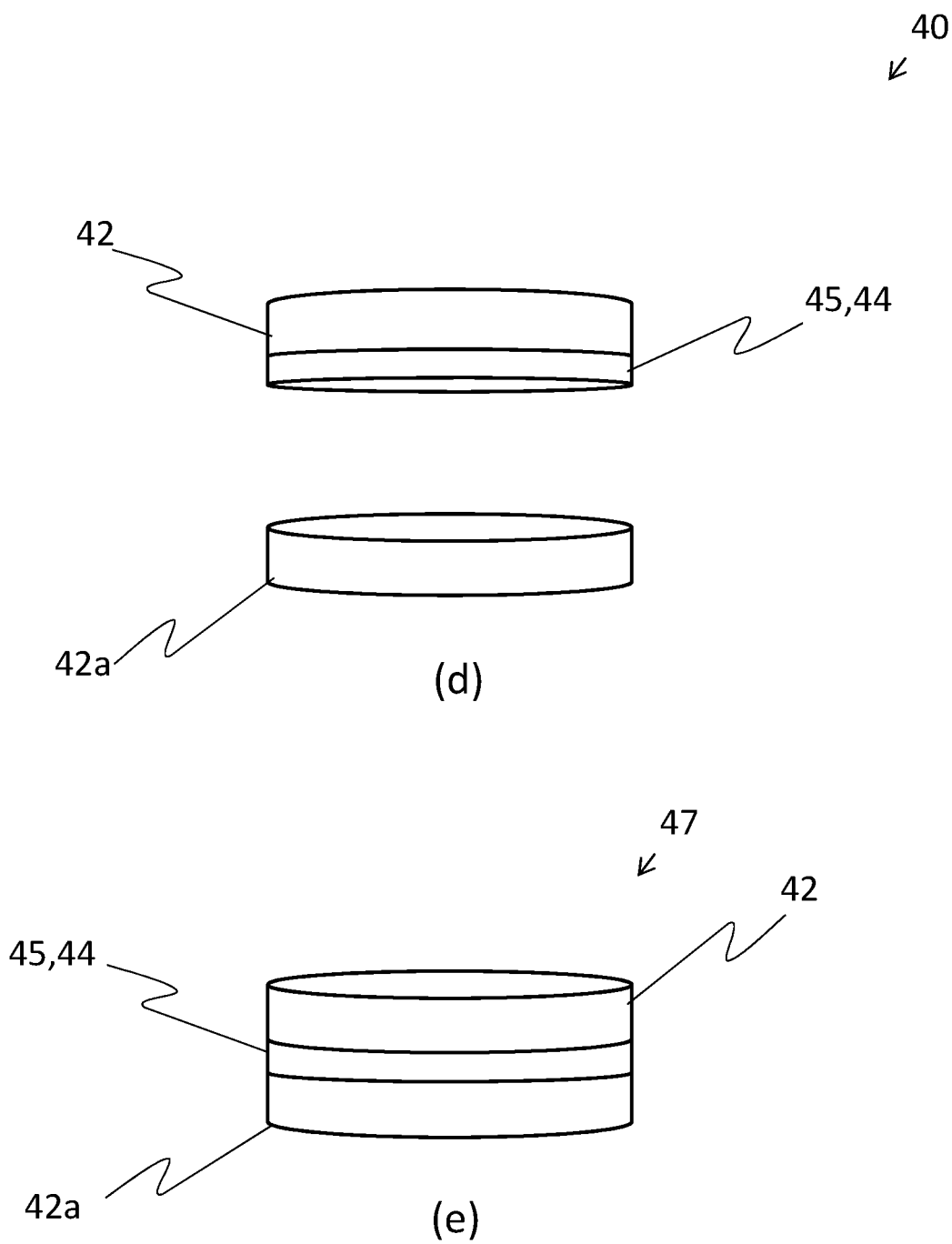
Figure 2C:
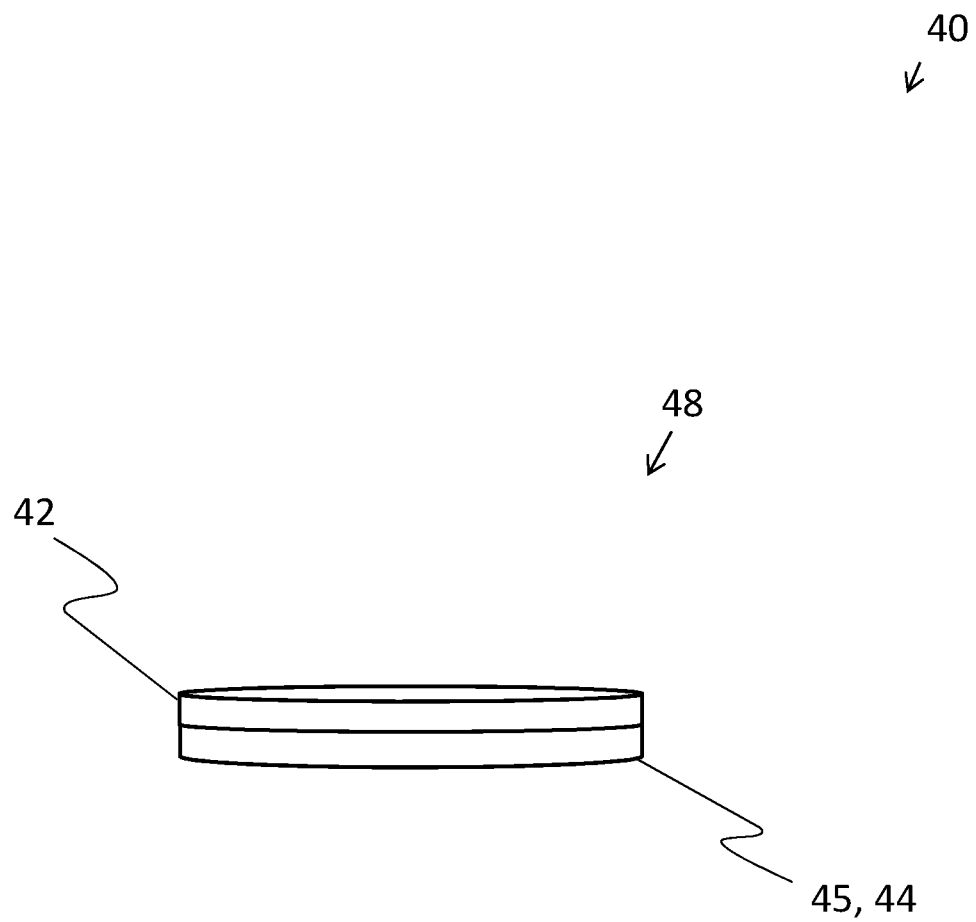
Figure 3A:
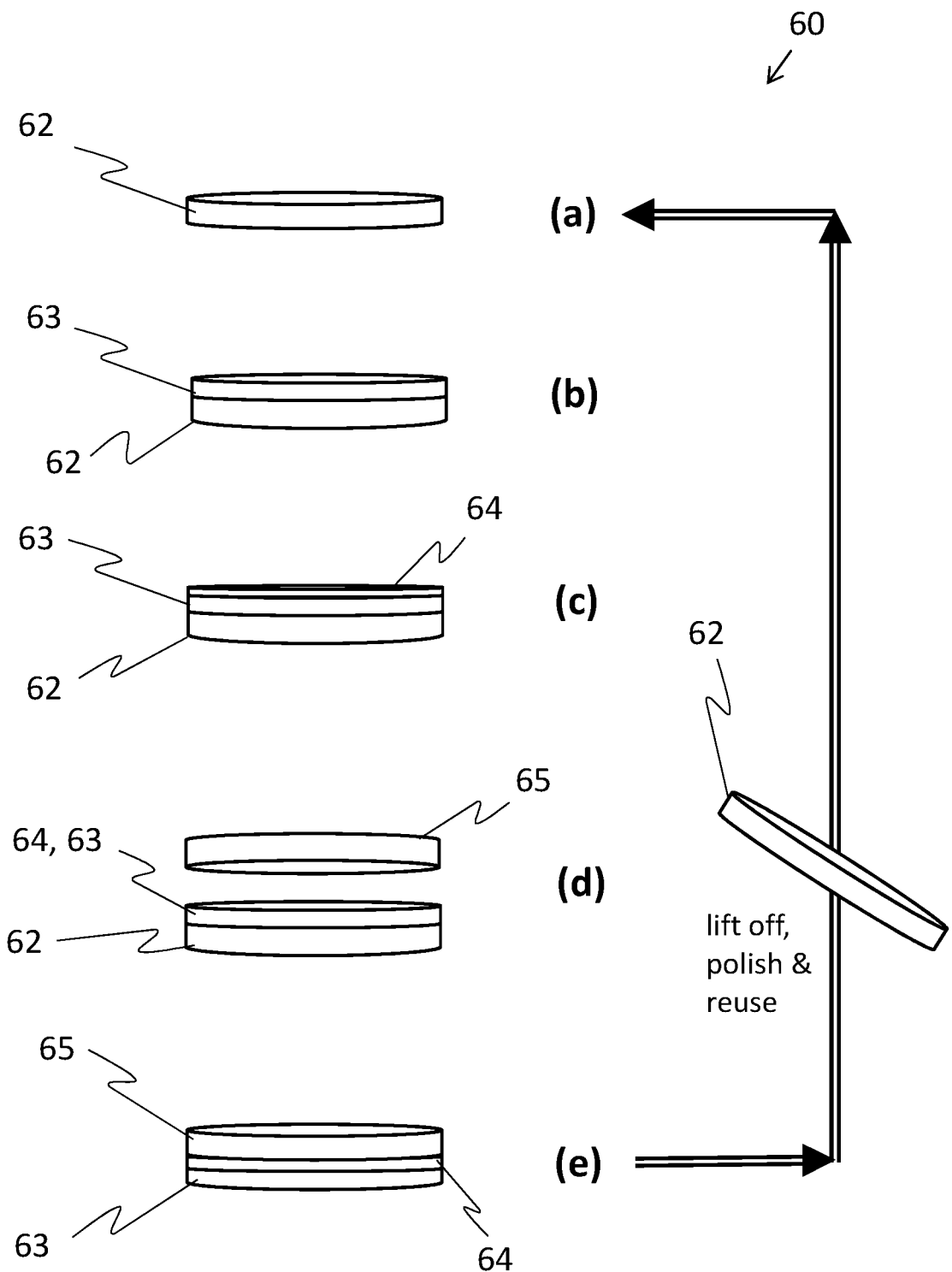
Figure 3B:
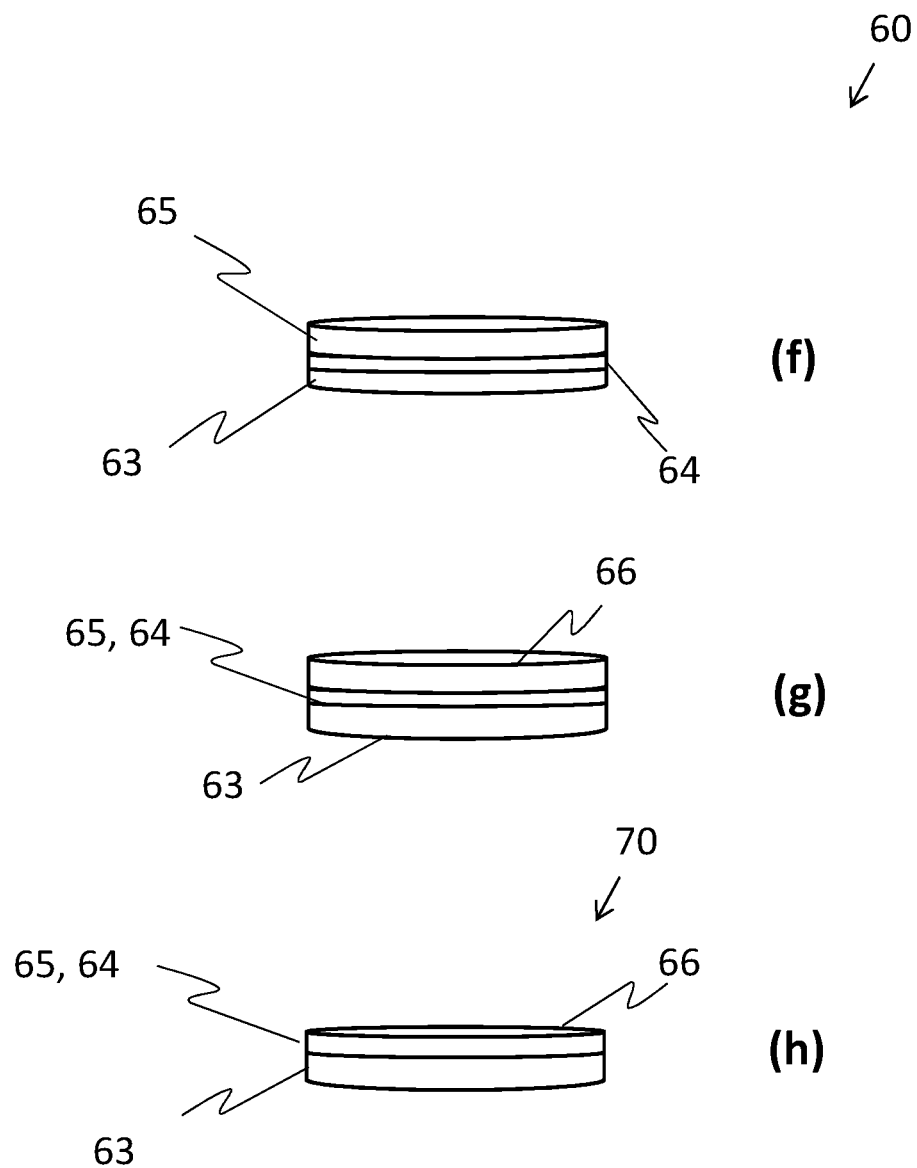

The invention is herein described, by way of example only, with reference to the accompanying drawings, wherein:

FIGS. 1A-1B are schematic illustrations showing major steps of a Prior Art manufacturing sequence of Silicon on Poly Silicon Carbide (SiC) wafers;

FIGS. 2A-2C are schematic illustrations of a cost-effective process, showing major steps to manufacture a semiconductor-on-multilayer (ML) composite wafer, having an exemplary silicon-on poly silicon carbide (pSiC) material, in accordance with embodiments of the current invention; and FIGS. 3A and 3B are schematic illustrations of a cost-effective process, showing major steps to manufacture a semiconductor-on-multilayer (ML) composite wafer, employing an exemplary gallium nitride (GaN)-on poly silicon carbide (SiC) material, in accordance with embodiments of the current invention.

DETAILED DESCRIPTION

The current invention relates to a cost-effective semiconductor-on-higher thermal conductive multi-layer composite wafer and methods thereof.

A salient point of an embodiment of the current invention is that of the thermal conductivity of part of the composite wafer. To be effective, the thermal conductivity of the composite wafer should be higher than that of the nominal thermal conductivity of Si or another semiconductor material, as known in the art. Silicon carbide is already widely accepted in semiconductor manufacturing as a material suitable for high-power devices. SiC is not available today in bulk at wafer diameters typically used today in semiconductor wafer IC manufacturing, namely diameters of 200 and 300 mm. Embodiments of the present invention are compatible with the wafer diameter dimensions noted hereinabove.

Embodiments of the apparatus of the current invention include a semiconductor wafer on a multilayered substrate made of composite layers which exhibit higher thermal conductivity properties than silicon—as noted hereinabove. The multi-layer (ML) substrate is made of a transitional layer (TL) and an additional layer (AL) as described hereinbelow.

The TL composite material is made of Aluminum Nitride (AlN), and/or Gallium Oxide ($Ga_2O_3$), and/or Gallium Nitride (GaN) and/or polycrystalline diamond having thicknesses less than 500 microns; and The AL is thicker than the TL layer and is made of polycrystalline Silicon Carbide (pSiC) and/or a high oriented-cubic phase 3C—SiC polytype crystal structure of Silicon Carbide (3C—SiC).

In the specification and appended claims hereinbelow, the term "vapor deposition" or "VD" is intended to mean any of the semiconductor fabrication deposition methods known in the art, such as but not limited to: metal organic chemical vapor deposition; hybrid vapor phase epitaxy; and molecular beam epitaxy methods.

Reference is currently made to FIGS. 2A-2C, which are schematic illustrations of a cost-effective process 40, showing major steps to manufacture a semiconductor-on-multilayer (ML) composite wafer, having an exemplary silicon-on poly silicon carbide (pSiC) material, in accordance with embodiments of the current invention.

1. The cost-effective process shown in FIG. 2A begins with step (a) taking a silicon wafer 42, on which the TL and the AL are subsequently formed in the current example of pSiC and/or a high oriented-cubic phase 3C—SiC polytype crystal structure of Silicon Carbide (3C—SiC).
2. The process continues (ref step (b) in FIG. 2A) with a TL 44, having properties of limiting diffusion, being grown with VD on wafer 42, as known in the art.
3. The process continues (ref step (c), FIG. 2A) with a VD process wherein a uniform and low-defect layer of an AL 45 is grown on the TL. In the current example, the AL is polycrystalline (pSiC) or high oriented-cubic phase SiC (3C—SiC).
4. After TL growth, process 40 continues (referring to FIG. 2B, step (d)) with AL layer 45 being polished by Chemical Mechanical Polishing (CMP), as known in the art, to prepare the surface for bonding.
5. The polished Si wafer is then bonded to another Si wafer 42a, as shown in step (e) in FIG. 2B. (Wafer 42a is also referred to hereinbelow as a "sacrificial silicon wafer".) The current step yields a ML "sandwich" wafer 47 comprised of a substrate (layers 44, 45) between two silicon wafers 42 and 42a. The bonding process is performed at room temperature using commercial equipment, such as room temperature bonders sold by Mitsubishi, as known in the art.
6. Process 40 continues in step (f) of FIG. 2C, sacrificial wafer 42a, which has heretofore provided only mechanical strength during the process, is removed and reused in another process. (Note that because sacrificial silicon wafer 42a was destined to be removed during the process, there are no stringent electrical requirements for the wafer, thereby yielding lower wafer cost.) The remaining wafer 48, is ground and polished by a CMP process to bring the surface of Si wafer 42 to the proper thickness and surface preparation, as known in the art. The resultant Si surface becomes the starting surface/material for device manufacturing, as known in the art.

The process described hereinabove in FIGS. 2A-2C is specifically based on the Si wafer surface pretreatment described, allowing growth of polycrystalline, cubic type βSiC layers, yielding silicon-on-multilayer (ML) composite wafer 30 having a total manufacturing cost ranging substantially from $200 to $300—which is significantly cheaper than prior art methods, costing typically 3-5 times more, as indicated hereinabove.

Significant cost reductions of embodiments of the current invention are obtained, inter alia, due to:

Replacement of the expensive pSiC prior art wafer with a low cost, low temperature, high deposition rate, VD pSiC deposition process dedicated for Si-on-pSiC wafer fabrication.

In addition to obviating the higher cost of the starting pSiC prior art wafer, the process of embodiments of the current invention is compatible with all wafer diameters and is, by nature, more flexible than and is not dependent on a fixed-diameter pSIC wafer.

Multi-use (typically 1000 times) of the sacrificial silicon wafer, thereby significantly lowering the cost of the sacrificial wafer in the process cost.

The process used in embodiments of the current invention is based on an original silicon surface pretreatment which allows growth of polycrystalline, cubic type βSiC layers. It is noted that the process is not limited to the exemplary SiC material described hereinabove, but that materials for the TL and AL layers may include any of the materials noted hereinabove, inter alia. An example of the use of the process of embodiments of the current invention applied to alternative materials and methods to produce cost-effective substrates is presented hereinbelow.

Reference is currently made to FIGS. 3A and 3B which are schematic illustrations of a cost-effective process 60, showing major steps to manufacture a semiconductor-on-multilayer (ML) composite wafer, employing an exemplary gallium nitride (GaN)-on poly silicon carbide (pSiC) material, in accordance with embodiments of the current invention.

1. Cost-effective process 60 shown in FIG. 3A beginning with step (a), taking a single crystal 6H SiC wafer 62. Wafer 62 has significant cost; but because the wafer is reused in the process as described hereinbelow, the approximate step cost is $50.
2. In step (b), a GaN layer 63, is "overgrown" on wafer 62 using a VD process and the approximate step cost is $700.
3. In step (c) of the process, a SiO2 layer 64 is grown on GaN layer 63. Layer 64 serves as an adhesion layer for introduction of a carrier silicon wafer, step (d).
4. In step (d), a carrier silicon wafer 65 is temporarily bonded to layer 64. Wafer 65 provides mechanical strength to the stack of layers to form process steps, as known in the art.
5. In step (e) (ref FIG. 3A) wafer 62 is removed using a GaN laser lift-off process. SiC wafer 62 is subsequently polished and reused in the process, starting with step (a) hereinabove.
6. Continuing with process 60, in step (f) of FIG. 3B, the unbonded surface of carrier silicon wafer 65 is polished, in preparation for the next step (g).
7. In step (g), a pSiC-CVD layer 66 is deposited on the polished surface of carrier wafer 65.
8. In the final step (h)—carrier wafer 65 undergoes a Si etch, as known in the art, yielding wafer 70 with a resultant GaN surface serving as the starting surface/material for subsequent device manufacturing, as known in the art.

Cost-effective process 60 is another example of an embodiment of the current invention offering a significantly cheaper process than that of the prior art. In the current example, wafer 70, having GaN-on poly silicon carbide (pSiC) material, is produced for a total cost of substantially $1,000 or less. In addition to the significant cost savings in producing wafer 70 compared to prior art methods (as described hereinabove), process 60 also offers the advantages of a wafer having:

low thermal resistivity substantially close to that of a single crystal SiC substrate; and low stress and dislocation density.

It will be appreciated that the above descriptions are intended only to serve as examples, and that many other embodiments are possible within the scope of the present invention as defined in the appended claims.

The invention claimed is:

1. A method for fabricating a cost-effective semiconductor on higher-thermal conductive multilayer (ML) composite wafer, the method comprising the steps of: taking a semiconductor host wafer having a first and a second host wafer surface and preparing the first host wafer surface growing a transitional layer (TL) having properties of limiting diffusion on the first host wafer surface having no implantation process; depositing a uniform and low-defect additional layer (AL) on the TL; polishing the AL to prepare for bonding; taking a sacrificial semiconductor wafer, having a first and second sacrificial wafer surface, and bonding the first sacrificial wafer surface to the AL at room temperature; removing the sacrificial wafer from the AL and recycling the sacrificial wafer for future use; and grinding and polishing the second host wafer surface; whereby the second host wafer surface becomes a starting surface of the ML composite wafer for device manufacturing.

2. The method of claim 1, whereby the TL has a thickness of less than 500 microns and is formed of at least two materials chosen from the list including: Aluminum Nitride (AlNi); Gallium Oxide (Ga2O3); Gallium Nitride (GaN); and polycrystalline diamond and the AL is thicker than the TL, the AL is formed of at least one material chosen from the list including: polycrystalline Silicon Carbide (pSiC); and a high oriented-cubic phase 3C—SiC polytype crystal structure of Silicon Carbide (3C—SiC).

3. The method of claim 2, whereby preparing the first host wafer surface includes a surface pretreatment which allows growth of polycrystalline, cubic type βSiC layers.

4. The method of claim 3, whereby the growth of polycrystalline, cubic type βSiC layers is compatible with all wafer diameters and is not dependent on a fixed-diameter pSIC wafer.

5. The method of claim 4, whereby the ML composite wafer has a total manufacturing cost ranging from 20% to 33% of other methods.

6. The method of claim 1, whereby the host and sacrificial wafers are formed of silicon.

7. The method of claim 1, whereby growing and depositing include vapor deposition methods.

* * * * *